US009619323B2

(12) United States Patent
Lee (10) Patent No.: US 9,619,323 B2
(45) Date of Patent: Apr. 11, 2017

(54) DATA STORAGE DEVICE AND OPERATING METHOD THEREOF

(71) Applicant: SK hynix Inc., Gyeonggi-do (KR)

(72) Inventor: Jong Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 107 days.

(21) Appl. No.: 14/631,389

(22) Filed: Feb. 25, 2015

(65) Prior Publication Data

US 2016/0139984 A1    May 19, 2016

(30) Foreign Application Priority Data

Nov. 17, 2014  (KR) ........................ 10-2014-0160064

(51) Int. Cl.
*G06F 11/10*    (2006.01)
*H03M 13/05*    (2006.01)
*H03M 13/09*    (2006.01)

(52) U.S. Cl.
CPC ......... *G06F 11/1048* (2013.01); *H03M 13/05* (2013.01); *H03M 13/09* (2013.01)

(58) Field of Classification Search
CPC .................................................. G06F 11/1076
USPC ................................ 714/758, 774, 764, 759
See application file for complete search history.

(56) References Cited

U.S. PATENT DOCUMENTS

| 8,578,247 | B2 * | 11/2013 | Zopf ..................... G10L 19/005 |
| | | | 714/3 |
| 2005/0120124 | A1 * | 6/2005 | Korhonen ............. H04L 1/0007 |
| | | | 709/231 |
| 2007/0147434 | A1 * | 6/2007 | Toyoda ............... H04J 14/0226 |
| | | | 370/503 |
| 2014/0089560 | A1 * | 3/2014 | Sunkavalli .......... G06F 12/0246 |
| | | | 711/103 |
| 2016/0036463 | A1 * | 2/2016 | Heisswolf ............. H03M 13/09 |
| | | | 714/764 |

FOREIGN PATENT DOCUMENTS

| KR | 1020130079850 | 7/2013 |
| KR | 1020130101149 | 9/2013 |

* cited by examiner

*Primary Examiner* — Fritz Alphonse
(74) *Attorney, Agent, or Firm* — IP & T Group LLP (57) ABSTRACT

A data storage device may include a memory device suitable for storing data and reading stored data as read data, and a bit distribution check unit suitable for performing a first error detection operation on the read data, based on a bit distribution of the read data.

16 Claims, 7 Drawing Sheets

| ECC Unit | Bit Distribution Check Unit | Subsequent Process |
|---|---|---|
| Error detected | -- | Correct error based on ECC algorithm |
| -- | Error detected | Correct error based on recovery information |
| Error detected | Error detected | Correct error based on ECC algorithm or recovery information |
| -- | -- | Process as normal data |

DATA STORAGE DEVICE AND OPERATING METHOD THEREOF

CROSS-REFERENCES TO RELATED APPLICATION

The present application claims priority under 35 U.S.C. §119(a) to Korean application number 10-2014-0160064, filed on Nov. 17, 2014, in the Korean Intellectual Property Office, which is incorporated herein by reference in its entirety.

BACKGROUND

1. Technical Field

Various embodiments relate to a data storage device and, more particularly, to a configuration and an operating method of a data storage device for improving the reliability thereof.

2. Related Art

A semiconductor memory device may be used to store data. Semiconductor memory devices may be divided into nonvolatile and volatile memory devices.

Nonvolatile memory devices maintain data stored therein even though power is cut off. Nonvolatile memory devices include flash memory devices such as NAND flash or NOR flash, FeRAM (Ferroelectrics Random Access Memory), PCRAM (Phase-Change Random Access Memory), MRAM (Magnetoresistive Random Access Memory) or ReRAM (Resistive Random Access Memory).

Volatile memory devices fail to maintain data stored therein when power is cut off. Volatile memory devices include SRAM (Static Random Access Memory) and DRAM (Dynamic Random Access Memory). Volatile memory devices are generally used as buffer memory devices, cache memory devices, or working memory devices in a data processing system, based on their relatively high processing speed.

SUMMARY

Various embodiments are directed to a data storage device data capable of improving data reliability.

In an embodiment of the present invention, a data storage device may include a memory device suitable for storing data and reading stored data as read data, and a bit distribution check unit suitable for performing a first error detection operation on the read data, based on a bit distribution of the read data.

In an embodiment of the present invention, an operating method of a data storage device may include performing a first error detection operation on data read from a memory device based on a bit distribution of the read data, and performing a second error detection operation on the read data based on an error correcting code (ECC) algorithm.

In an embodiment of the present invention, an operating method of a data storage device may include generating recovery information on write data, and storing the write data and the recovery information in a plurality of memory devices. The recovery information may be stored in a designated memory region that is selected on the basis of erase count information, in one of the plurality of memory devices.

BRIEF DESCRIPTION OF THE DRAWINGS

Features, aspects, and embodiments are described in conjunction with the attached drawings, in which.

DETAILED DESCRIPTION

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more dearly depict certain features of the invention. While particular terminology is used, it is to be appreciated that the terminology used is for describing particular embodiments only and is not intended to limit the scope of the present invention.

Figure 1:
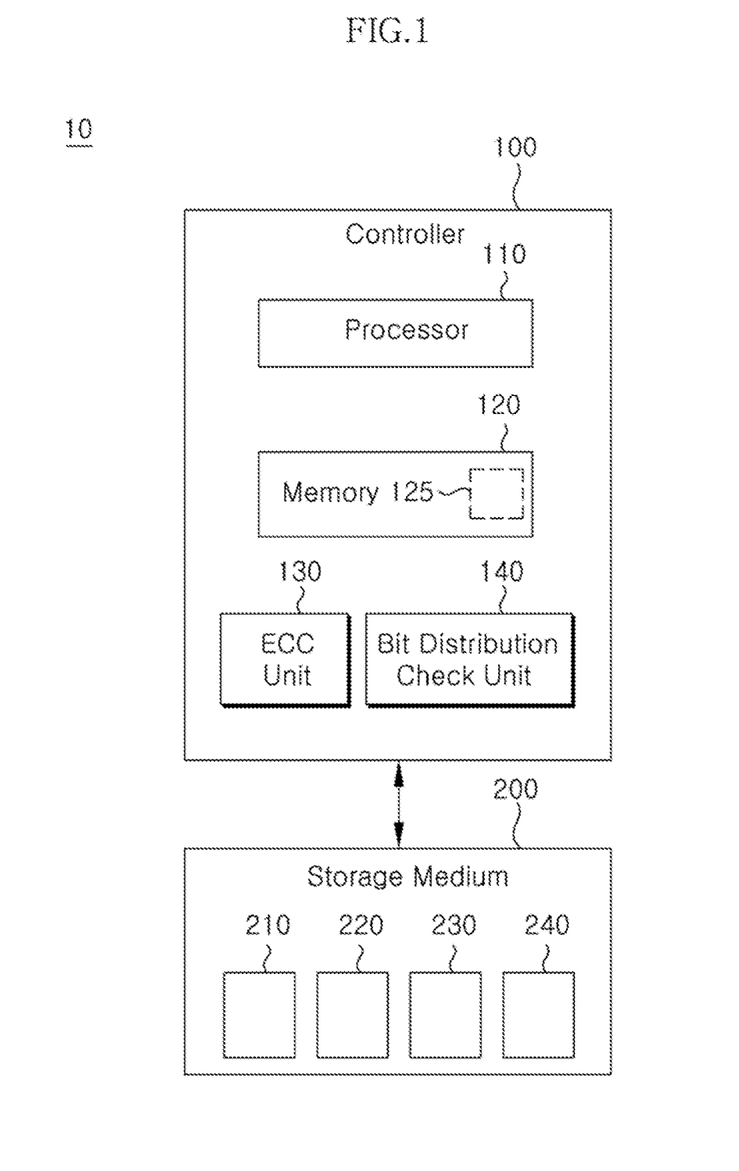
FIG. 1 is a diagram illustrating a data storage device according to an embodiment of the present invention.

FIG. 1 is a diagram illustrating a data storage device 10 according to an embodiment of the present invention.

The data storage device 10 may be configured to store data provided from an external device (not illustrated) in response to a write request of the external device. Furthermore, the data storage device 10 may be configured to provide data stored therein to the external device in response to a read request of the external device. The external device is an electronic device capable of processing data, and may include a computer, a digital camera, or a mobile phone. The data storage device 10 may be fabricated and operated in a state where it is mounted in the external device. Alternatively, the data storage device 10 may be fabricated in a single device and operated when coupled to the external device.

The data storage device 10 may include a PCMCIA (Personal Computer Memory Card International Association) card, a CF (Compact Flash) card, a smart media card, a memory stick, various multimedia cards (MMC, eMMC, RS-MMC, MMC-micro), an SD (Secure Digital) card (SD, Mini-SD, Micro-SD), UFS (Universal Flash Storage), or an SSD (Solid State Drive).

The data storage device 10 may include a controller 100 and a storage medium 200.

The controller 100 may include a processor 110, a memory 120, an error correcting code (ECC) unit 130, and a bit distribution check unit 140.

The processor 110 may control overall operations of the data storage device 10. The processor 110 may drive a software program for controlling the operation of the data storage device 10 on the memory 120.

The processor 110 may generate recovery information on data to be written to the storage medium 200. Hereafter, the data will be referred to as write data. The recovery information may be used for an error correcting operation, if the write data contains an error when the write data stored in the storage medium 200 are read from the storage medium 200. For example, the recovery information may include parity data on the write data.

The processor 110 may control the generated recovery information to be stored in a designated memory region selected on the basis of erase count information 125, such that the generated recovery information is more stably stored. The processor 110 may select the designated memory region in which the recovery information is to be stored, based on the erase count information 125.

The erase count information 125 may include counts of erase operations performed for the memory devices 210 to 240, respectively, for example. The processor 110 may select any one of the memory devices 210 to 240 as the designated memory region, by referring to the counts of erase operations performed for the respective memory devices 210 to 240. For another example, the erase count information may include counts of erase operations performed for the memory blocks included in each of the memory devices 210 to 240. The processor 110 may select any one of the memory blocks as the designated memory region, by referring to the counts of erase operations performed for the respective memory blocks.

The data storage device 10 may use the erase count information 125 to estimate the lifetime or performance of a predetermined unit of memory regions, and store the recovery information in a more stable memory region based on the erase count information 125, thereby providing improved data reliability.

The processor 110 may control the write data and the generated recovery information to be stored in the memory devices 210 to 240. The processor 110 may control the recovery information to be stored in the designated memory region, and control the write data to be stored in memory regions other then the designated memory region. The method for storing the write data and the recovery information will be described below in detail with reference to FIGS. 4 and 5.

The processor 110 may perform an error correcting operation based on recovery information corresponding to data read from the storage medium 200, when an error detection report on the read data is received from the bit distribution check unit 140. The processor 110 may read the recovery information corresponding to the read data from the storage medium 200, in order to perform the error correcting operation.

The memory 120 may function as a working memory, a buffer memory, or a cache memory of the processor 110. The memory 120 may serve as a working memory that stores various program data and software programs driven by the processor 110. The memory 120 may serve as a buffer memory that buffers data transmitted between the external device and the storage medium 200. The memory 120 may serve as a cache memory that temporarily stores cache data.

The memory 120 may store the erase count information 125 that is referred to by the processor 110.

Before the write data and the recovery information, generated by the processor 110, are stored in the storage medium 200, the ECC unit 130 may encode the write data and the recovery information based on an ECC algorithm. The ECC unit 130 may read the write data and the recovery information on a page basis on which a write operation is performed in each of the memory devices 210 to 240, for example, and encode the write data and the recovery information on a page basis.

The ECC unit 130 may perform an error detection operation for determining whether read data contains an error, based on the ECC algorithm. The ECC unit 130 may correct the error by decoding the read data based on the ECC algorithm, when determining that the read data contains the error.

The bit distribution check unit 140 may perform an error detection operation on the read data, based on the bit distribution of the read data. Specifically, the bit distribution check unit 140 may calculate a deflection factor of the read data based on a bit distribution of the read data, that is a distribution of "0" and "1" When the calculated deflection factor exceeds a threshold value, the bit distribution check unit 140 may determine that the read data contains an error. The bit distribution check unit 140 may transmit an error detection report to the processor 110 according to the determination result.

The deflection factor may indicate the extent to which the bit distribution of the read data is biased to a specific value. The deflection factor may indicate the higher value between the distribution ratios of "0" and "1" in the read data. At this time, the sum of the distribution ratios of "0" and "1" is 100%. For example, the deflection factor of read data "0000010000" may correspond to 90%. For another example, the deflection factor of read data "1100011111" may be 70%.

That is, when the deflection factor of the read data exceeds the threshold value and indicates an extremely high deflection factor, the read data is highly likely to contain an error. Thus, the bit distribution check unit 140 may perform an error detection operation based on the bit distribution of the read data.

The ECC unit 130 and the bit distribution check unit 140 may receive read data from the storage medium 200, and independently perform an error detection operation on the read data. The error detection operations of the ECC unit 130 and the bit distribution check unit 140 may be complementarily performed. For example, the bit distribution check unit 140 may detect an error which cannot be detected by the ECC unit 130, as the read data exceeds the error correcting ability of the ECC unit 130. Thus, the data storage device 10 may provide an improved error detection ability and guarantee improved data reliability, compared to when only the ECC unit 130 is used to perform an error detection operation.

Figure 2:
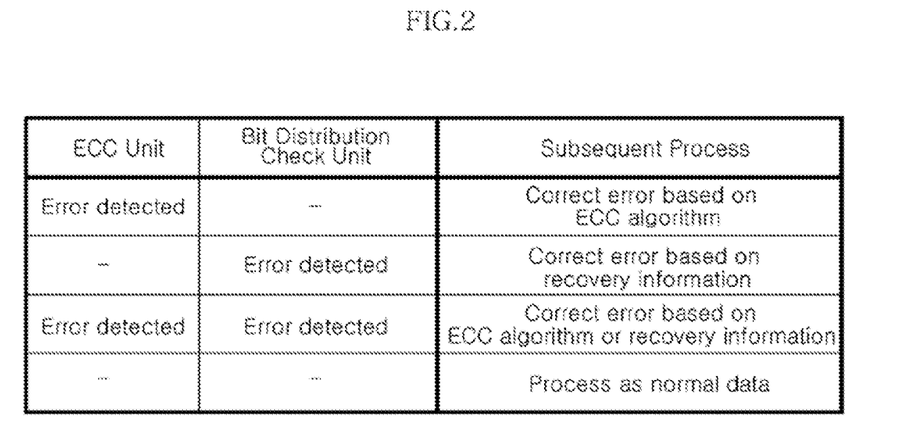
FIG. 2 is a table showing the results of error detection operations performed on read data by an ECC unit and a bit distribution check unit of FIG. 1, and subsequent processes corresponding to the results.

FIG. 2 is a table showing the results of error detection operations performed on read data by the ECC unit 130 and the bit distribution check unit 140 and subsequent processes corresponding to the results. In FIG. 2, "error detected" indicates when it is determined that read data contains an error, through an error detection operation.

When the ECC unit 130 detects an error, the ECC unit 130 may correct an error based on the ECC algorithm.

When the bit distribution check unit 140 detects an error, the processor 110 receiving an error detection report from the bit distribution check unit 140 may correct the error using the recovery information.

When both of the ECC unit 130 and the bit distribution check unit 140 detect an error, the ECC unit 130 may correct an error based on the ECC algorithm, or the processor 110 may correct an error using the recovery information.

When both of the ECC unit 130 and the bit distribution check unit 140 do not detect an error, the processor 110 may process read data as normal data.

In short, when an error is detected by the ECC unit 130, an error correction operation may be performed by the ECC unit 130 itself based on the ECC algorithm. When an error is detected by the bit distribution check unit 140, an error correction operation may be performed by the processor 110 using the recovery information.

Referring to FIG. 1, the storage medium 200 may include first to fourth memory devices 210 to 240. The first to fourth memory devices 210 to 240 may include a nonvolatile memory device, such as a flash memory device including NAND flash or NOR flash, FeRAM (ferroelectrics Random Access Memory), PRAM (Phase-Change Random Access Memory), MRAM (Magnetoresistive Random Access Memory) or ReRAM (Resistive Random Access Memory). FIG. 1 illustrates that the storage medium 200 includes four memory devices 210 to 240. However, the number of memory devices included in the storage medium 200 is not limited thereto. Each of the first to fourth memory devices 210 to 240 may write data transmitted from the controller 100 or read data stored therein to transmit the read data to the controller 100, under the control of the controller 100.

Figure 3:
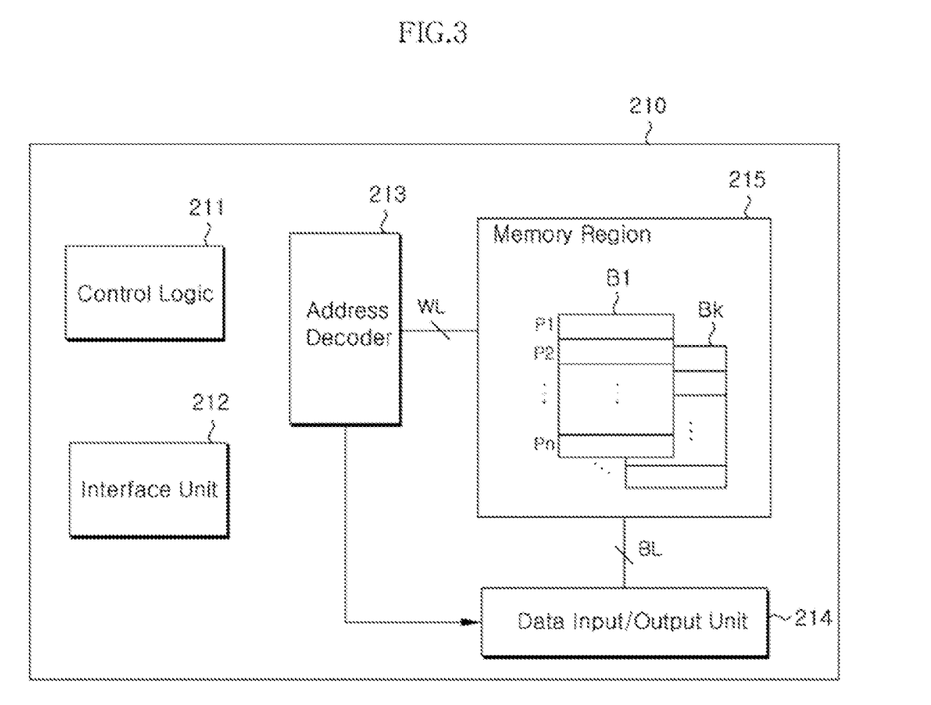
FIG. 3 is a block diagram illustrating a first memory device of FIG. 1.

FIG. 3 is a block diagram illustrating the first memory device 210 of FIG. The second to fourth memory devices 220 to 240 illustrated in FIG. 1 may be configured and operated in substantially the same manner as the first memory device 210.

The first memory device 210 may include a control logic 211, an interface unit 212, an address decoder 213, a data input/output unit 214, and a memory region 215.

The control logic 211 may control overall operations such as a write operation, a read operation, and an erase operation of the first memory device 210, under the control of the controller 100.

The interface unit 212 may exchange data and various control signals including commands and addresses with the controller 100. The interface unit 212 may transmit the various control signals and data to internal units of the first memory device 210.

The address decoder 213 may decode a received row address and column address. The address decoder 213 may control word lines WL to be selectively driven according to the decoding result of the row address. The address decoder 213 may control the data input/output unit 214 to selectively drive the bit lines BL, according to the decoding result of the column address.

The data input/output unit 214 may transmit the data received from the interface unit 212 to the memory region 215 through the bit lines BL. The data input/output unit 214 may transmit the data read through the bit lines BL, from the memory region 215 to the interface unit 212.

The memory region 215 may be coupled to the address decoder 213 through the word lines WL, and coupled to the data input/output unit 214 through the bit lines BL. The memory region 215 may include a three-dimensional memory cell array, for example. The memory region 215 may include a plurality of memory blocks B1 to Bk. Each of the memory blocks B1 to Bk may include a plurality of pages P1 to Pn.

The first memory device 210 may perform an erase operation on a memory block basis. The first memory device 210 may perform a write operation or read operation on a page basis. The pages included in an erased free memory block may be written in a write sequence. The write sequence may indicate a page number sequence, which is set based on an offset value.

Figure 4A:
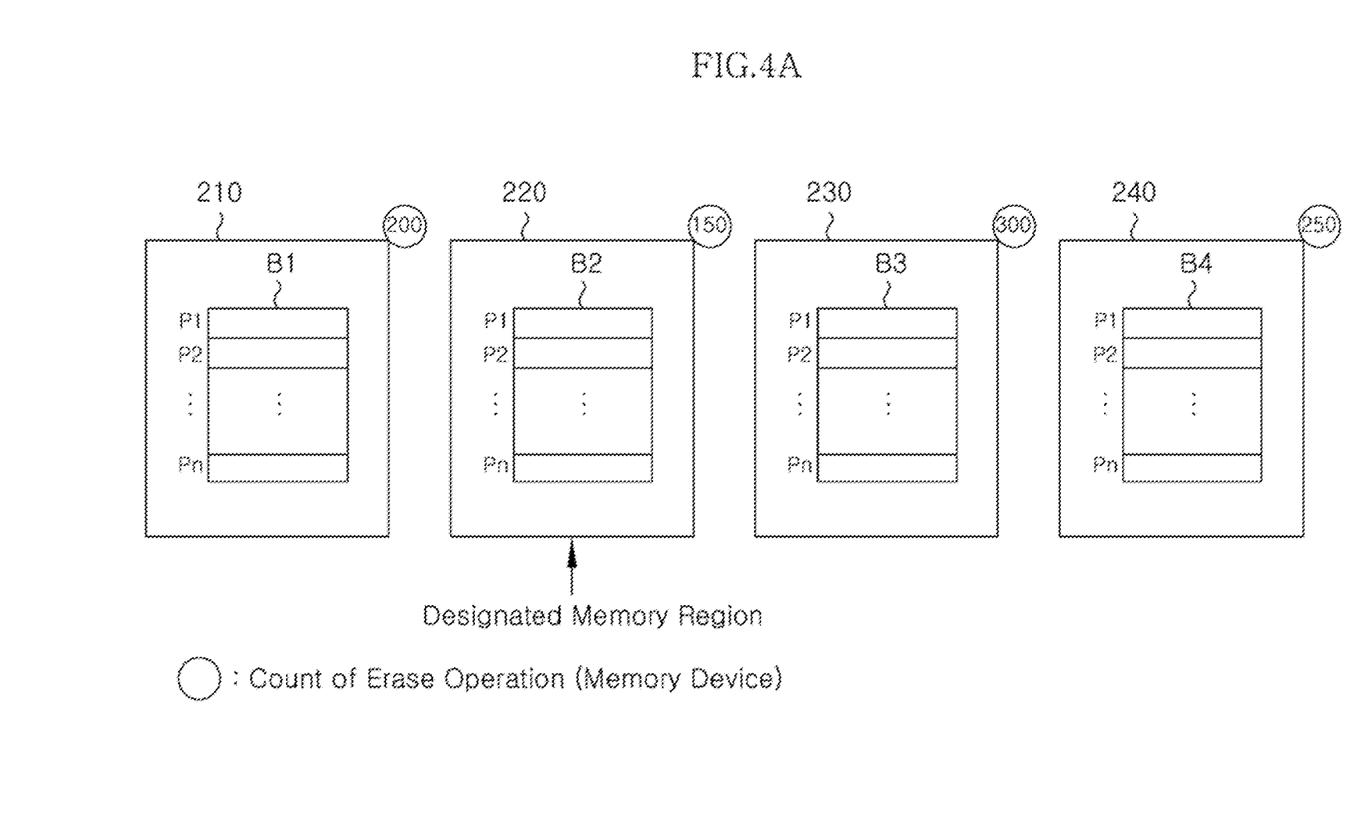
FIGS. 4A and 4B are diagrams illustrating a method for selecting a designated memory region in which the data storage device of FIG. 1 stores recovery information.
Figure 4B:
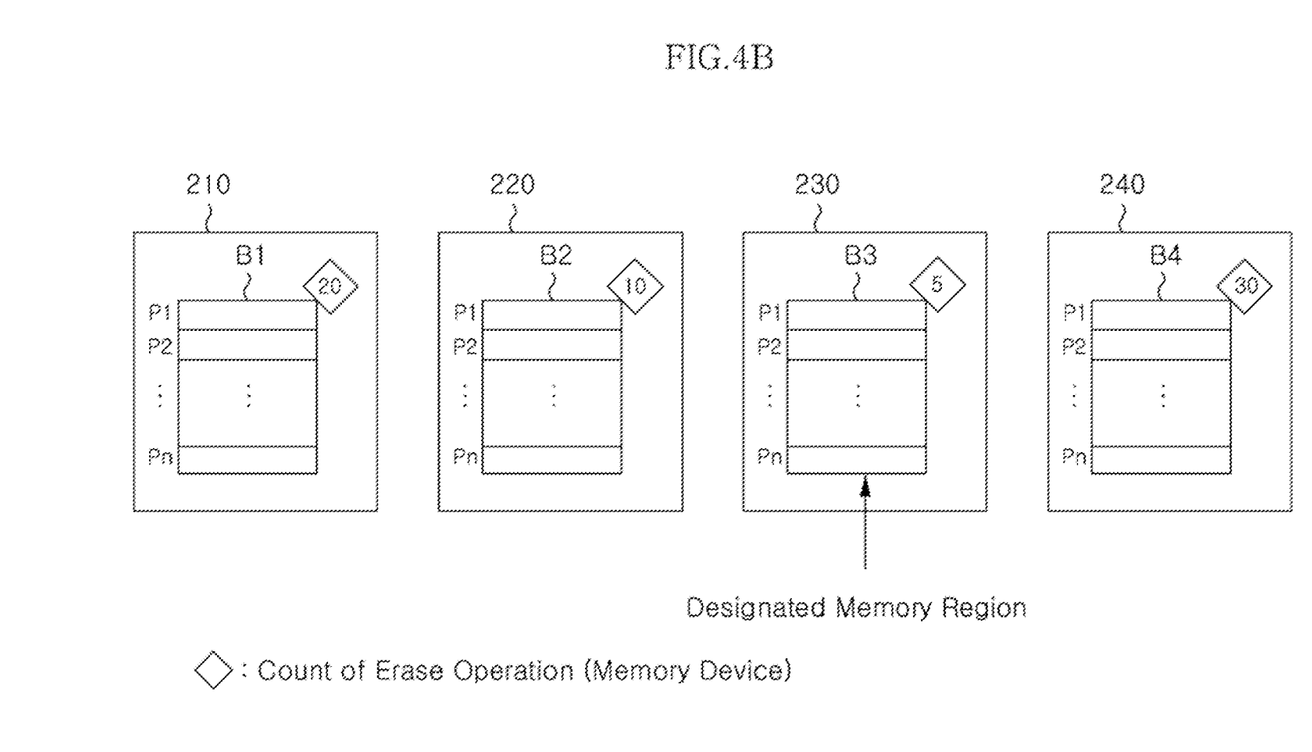

FIGS. 4A and 4B are diagrams illustrating a method for selecting a designated memory region in which the data storage device 10 of FIG. 1 stores recovery information.

FIG. 4A illustrates counts of erase operations performed for the respective memory devices 210 to 240. The processor 110 may select the memory device having the smallest erase count, for example, the second memory device 220, as a designated memory region in which the recovery information is to be stored, by referring to the counts of erase operations performed for the respective memory devices 210 to 240.

FIG. 4B illustrates counts of erase operations performed for free memory blocks B1 to B4 included in the respective memory devices 210 to 240. The processor 110 may select the memory block having the smallest erase count, for example, the third memory block B3 as a designated memory region by referring to the counts of erase operations performed for the respective memory devices 210 to 240.

For example, when the selected designated memory region has no space to store the recovery information, the processor 110 may newly select a designated memory region. For another example, the processor 110 may newly select a designated memory region by predetermined periods.

Figure 5:
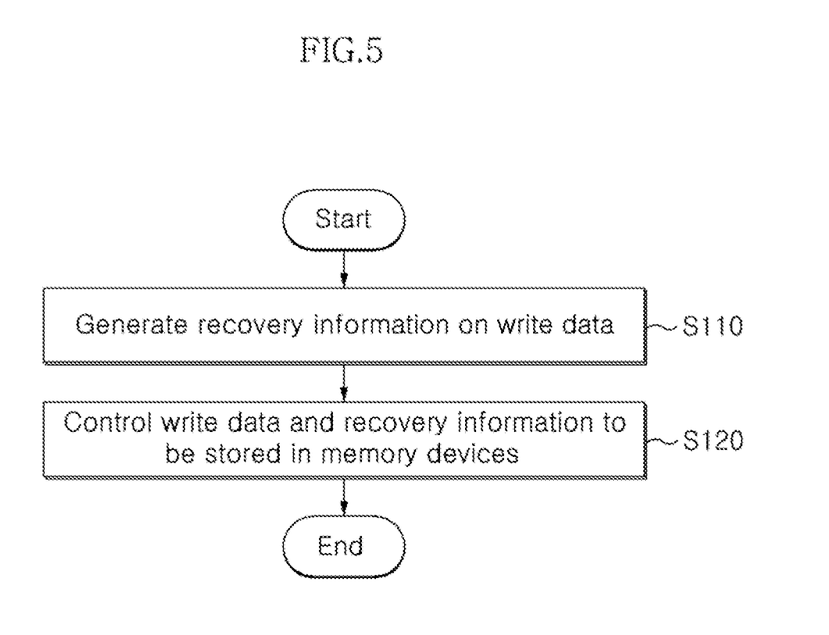
FIG. 5 is a flowchart for describing a method in which the data storage device of FIG. 1 stores write data and recovery information.
Figure 6:
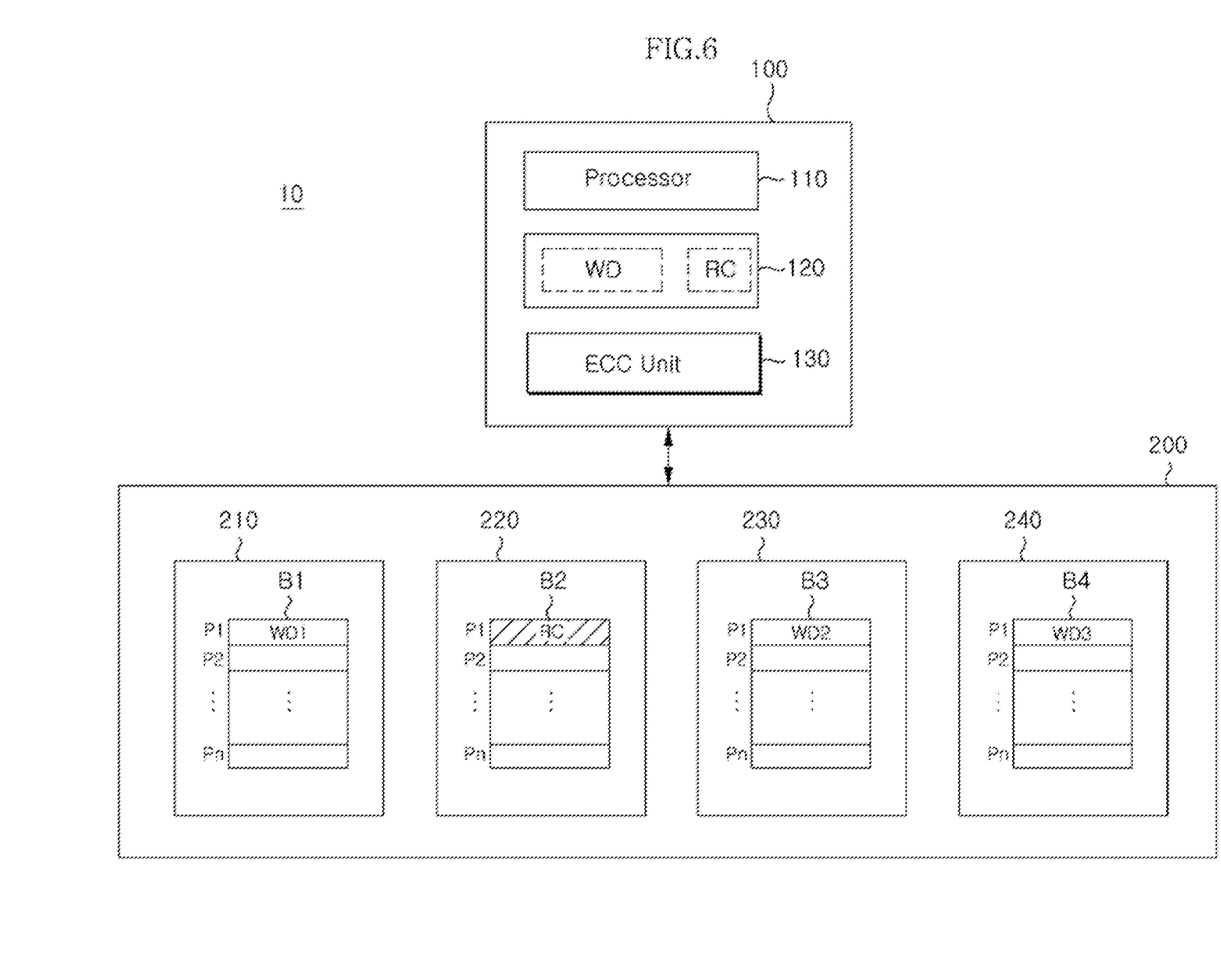
FIG. 6 is a diagram for describing a method in which the data storage device of FIG. 1 stores write data and recovery information.

FIGS. 5 and 6 are a flowchart and a diagram for describing a method in which the data storage device 10 of FIG. 1 stores write data WD and recovery information RC. In FIG. 6, it is described as an example that the data storage device 10 selects the second memory device 220 as a designated memory region, based on counts of erase operations performed for the respective memory devices 210 to 240.

At step S110, the processor 110 may generate recovery information RC on write data WD. For example, the processor 110 may generate the recovery information RC on the write data WD in the memory 120. The processor 110 may generate the recovery information RC on a page basis. The recovery information RC may include parity data on the write data WD. For example, the processor 110 may perform a write operation on the memory devices 210 to 240 in an interleaving manner.

At step S120, the processor 110 may control the write data WD and the recovery information RC to be stored in the memory devices 210 to 240. At this time, the recovery information RC may be stored in the designated memory region 220, and the write data WD may be stored in memory regions other than the designated memory region 220. For example, the write data WD may be divided on a page basis, and the divided write data WD1 to WD3 may be stored in the memory devices 210, 230, and 240, respectively. The write data WD and the recovery information RC may be stored in pages having the same offset value in the memory blocks, for example, the first pages P1 of the respective memory blocks B1 to B4, of the respective memory devices 210 to 240. The write data WD and the recovery information RC may be encoded by the ECC unit 130 and then stored in the respective memory devices 210 to 240.

Figure 7:
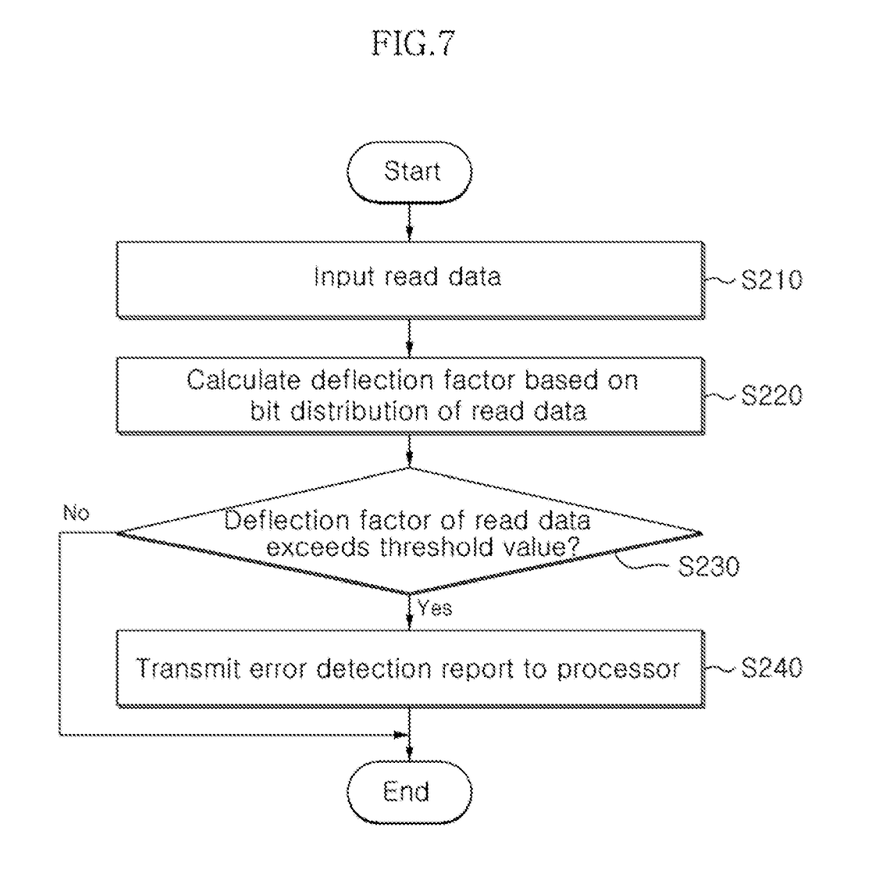
FIG. 7 is a flowchart for describing a method in which a bit distribution check unit of FIG. 1 performs an error detection operation.

FIG. 7 is a flowchart for describing a method in which the bit distribution check unit 140 of FIG. 1 performs an error detection operation.

At step S210, the bit distribution check unit 140 may receive read data from the storage medium 200.

At step S220, the bit distribution check unit 140 may calculate a deflection factor based on the bit distribution of the read data. The deflection factor may indicate the extent to which the bit distribution of the read data is biased to a specific value. The deflection factor may indicate the higher value between the distribution ratios of "0" and "1" in the read data.

At step S230, the bit distribution check unit 140 may determine whether the deflection factor of the read data exceeds a threshold value. When it is determined that the deflection factor of the read data exceeds the threshold value, the procedure may proceed to step S240. When it is determined that the deflection factor of the read data does not exceed the threshold value, the procedure may be ended.

At step S240, the bit distribution check unit 140 may transmit an error detection report to the processor 110. The processor 110 may read recovery information corresponding to the read data and perform an error correcting operation on the read data, in response to the error detection report.

According to the embodiments of the present invention, the data storage device may guarantee the data reliability through the improved recovery information management ability and the improved error detection ability.

While certain embodiments have been described above, it will be understood to those skilled in the art that the embodiments described are examples only. Accordingly, the device and method described herein should not be limited based on the described embodiments. Rather, the device and method described herein should only be limited in light of the claims that follow when taken in conjunction with the above description and accompanying drawings.

What is claimed is:

1. A data storage device comprising:
   a memory device suitable for storing data and reading stored data as read data; and
   a bit distribution check unit suitable for calculating a deflection factor based on a bit distribution of the read data and performing a first error detection operation on the read data based on the deflection factor.

2. The data storage device of claim 1, further comprising:
   an error correcting code (ECC) unit suitable for performing a second error detection operation on the read data based on an ECC algorithm.

3. The data storage device of claim 2, wherein the bit distribution check unit and the ECC unit respectively and independently perform the first and the second error detection operations on the read data.

4. The data storage device of claim 1, wherein the bit distribution check unit determines that the read data contains an error when the deflection factor exceeds a threshold value.

5. The data storage device of claim 1, further comprising:
   a processor suitable for performing an error correction operation on the read data based on parity data corresponding to the read data, in response to a result of the first error detection operation of the bit distribution check unit.

6. The data storage device of claim 5, wherein the processor generates the parity data and stores the parity data in the memory device when the memory device stores the data,
   wherein the parity data is stored in a designated memory region of the memory device, which is selected on a basis of erase count information on the memory device.

7. The data storage device of claim 2, wherein the ECC unit performs a second error correction operation on the read data based on the ECC algorithm, in response to a result of the second error detection operation.

8. An operating method of a data storage device, comprising:
   calculating a deflection factor based on a bit distribution of data read from a memory device; and
   performing a first error detection operation on the read data based on the deflection factor.

9. The operating method of claim 8, wherein the performing of the first error detection operation comprises:
   determining that the read data contains an error, when the deflection factor exceeds a threshold value.

10. The operating method of claim 8, further comprising:
    performing a first error correction operation on the read data based on parity data corresponding to the read data, in response to a result of the first error detection operation.

11. The operating method of claim 8, further comprising:
    performing a second error detection operation on the read data based on an error correcting code (ECC) algorithm.

12. The operating method of claim 11, wherein the first and second error detection operations are independently performed.

13. The operating method of claim 11, further comprising:
    performing a second error correction operation on the read data based on the ECC algorithm, in response to a result of the second error detection operation.

14. An operating method of a data storage device, comprising:
    generating recovery information on write data;
    selecting free memory blocks from respective memory devices;
    selecting a free memory block having the smallest count of erase operations performed thereon, among selected free memory blocks, as a designated memory region; and
    storing the write data and the recovery information in the memory devices,
    wherein the recovery information is stored in the designated memory region.

15. The operating method of claim 14, wherein the write data are divided on a page basis and stored in free memory blocks, other than the free memory block selected as the designated memory region, among the selected free memory blocks.

16. The operating method of claim 14, wherein the write data and the recovery information are stored in pages having the same offset value in the selected free memory blocks.

* * * * *